United States Patent [19]

Fujikawa et al.

[11] Patent Number: 5,306,950
[45] Date of Patent: Apr. 26, 1994

[54] ELECTRODE ASSEMBLY FOR A SEMICONDUCTOR DEVICE

[75] Inventors: Hisayoshi Fujikawa; Koji Noda; Takeshi Ohwaki; Yasunori Taga, all of Aichi, Japan

[73] Assignee: Kabushiki Kaisha Toyota Chuo Kenkyusho, Aichi, Japan

[21] Appl. No.: 994,913

[22] Filed: Dec. 22, 1992

[30] Foreign Application Priority Data

Dec. 26, 1991 [JP] Japan .................. 3-345598

[51] Int. Cl.$^5$ .................. H01L 23/48; H01L 29/46; H01L 29/54; H01L 29/62
[52] U.S. Cl. .................. 257/750; 257/751; 257/754; 257/741; 252/521; 252/509; 252/513; 252/519
[58] Field of Search .............. 257/750, 751, 741, 32, 257/661, 486, 772, 754, 779; 75/610; 29/599, 572; 252/521, 509, 513, 519, 62.3 R

[56] References Cited

U.S. PATENT DOCUMENTS

| | | | |
|---|---|---|---|
| 3,766,445 | 10/1973 | Reuter et al. | 317/235 R |
| 4,394,673 | 7/1983 | Thompson et al. | 357/15 |
| 4,480,261 | 10/1984 | Hattori et al. | 357/71 |
| 4,534,099 | 8/1985 | Howe | 29/572 |
| 4,668,374 | 5/1987 | Bhagat et al. | 204/412 |
| 4,847,675 | 7/1989 | Eng | 357/71 |
| 4,965,656 | 10/1990 | Koubuchi et al. | 357/71 |

FOREIGN PATENT DOCUMENTS 63-60537  3/1988  Japan .

OTHER PUBLICATIONS

Baglin, et al., Appl. Phys. Lett., vol. 36, No. 7, Apr. 1980, pp. 594-596. "The formation of silicides from thin films of some rare-earth metals".

Tu, et al., Appl. Phys. Lett., vol. 38, No. 8, Apr. 1981, pp. 626-628. "Low Schottky barrier of rare-earth silicide on n-Si".

Primary Examiner—Andrew J. James
Assistant Examiner—T. M. Arroyo
Attorney, Agent, or Firm—Oblon, Spivak, McClelland, Maier & Neustadt

[57] ABSTRACT

An electrode assembly for a semiconductor device includes a contact layer formed on a semiconductor substrate and consisting mainly of a rare-earth metal or metals, or a silicide thereof, or a mixture thereof, and a diffusion barrier layer formed on the contact layer and consisting mainly of iron or an iron alloy. The assembly is bonded to a mount by a solder layer formed on the diffusion barrier layer and consisting mainly of lead and tin.

6 Claims, 1 Drawing Sheet

ELECTRODE ASSEMBLY FOR A SEMICONDUCTOR DEVICE

BACKGROUND OF THE INVENTION

1. Field of the Invention

This invention relates to an electrode assembly for a semiconductor device, and more particularly, to an electrode assembly which is bonded between a semiconductor substrate and its mount with a solder consisting mainly of lead and tin.

2. Description of the Related Art

The recent advance in semiconductor technology has brought about the development of various kinds of semiconductor devices. The external electrical connection of any such device has a critical bearing on its performance. While it is essential to employ an electrode for the electrical connection of a semiconductor device to enable it to perform the desired function, the device does not show any satisfactory performance if the lead wire, etc. connected to the electrode causes the diffusion of impurities, or if its electrical connection to the semiconductor is incomplete for the complete transmission of signals.

The external electrical connection of a semiconductor device has usually been achieved by bonding a semiconductor substrate to its mount. The substrate has a chromium or titanium layer and a nickel layer formed one upon the other on its back surface and these electrode layers are bonded to the mount with a solder layer. The chromium or titanium layer forms a layer of contact with the semiconductor, while the nickel layer is a layer for preventing the diffusion of tin from the solder to the substrate. This arrangement makes it possible to maintain the satisfactory electrical connection of the device, while preventing the diffusion of impurity (tin in the solder) to the substrate.

The recent advance in semiconductor technology has, however, created a demand for an electrode construction capable of electrical connection with a lower resistance to a silicon wafer having a high resistivity to obtain a device of higher accuracy in performance. The electrode construction as hereinabove described has too high a contact resistance to achieve any ohmic connection with a satisfactorily low electrical resistance.

It is known that rare-earth metals or rare earth silicides having a low Schottky-barrier height offer a lower contact resistance than chromium or other metals. See e.g. Applied Physics Letters 36(7), 594 (1980) and 38(8), 626 (1981). The rare-earth metals, or silicides are, however, too easily oxidized by reacting with oxygen to be suitable for use in any ordinary electrode construction. If a layer of TiW or tungsten is used as a layer for preventing the diffusion of tin from a solder to a semiconductor, it is possible to prevent the oxidation of a rare-earth metal, or silicide, but the use of any such layer does not make any readily acceptable electrode, since it can only poorly be wetted with the solder.

An electrode assembly comprising layers of a rare-earth metal, nickel and gold may be derived from a known combination of chromium, nickel and gold. It can satisfactorily be bonded with a solder and prevent the diffusion of tin therefrom, but as nickel diffuses into reacts with the rare-earth metal and a semiconductor upon heat treatment at a temperature of about 250° C., it cannot maintain a low specific contact resistivity at varying temperatures, and is, therefore, a construction which is totally unacceptable for practical use.

There has also been proposed an electrode construction which includes an iron-alloy layer for preventing the diffusion of tin. Japanese Patent Application laid open under No. Sho 63-60537 discloses a combination of iron silicide, iron and an Fe-Sn alloy. This construction has, however, the drawback that it cannot maintain a satisfactorily low specific contact resistivity at the interface with a semiconductor and form a contact having a satisfactorily low resistance with a silicone wafer having a high resistivity, though it can effectively prevent the diffusion of tin through iron.

SUMMARY OF THE INVENTION

Under these circumstances, it is an object of this invention to provide an electrode assembly for a semiconductor device which can maintain a satisfactorily low specific contact resistivity at the interface with a semiconductor substrate having a high resistivity, can be bonded easily with a solder, while preventing the diffusion of tin therefrom, and has a high thermal stability.

This object is essentially attained by an electrode assembly which comprises a semiconductor substrate, a contact layer formed on the substrate and consisting mainly of at least one rare-earth metal, a silicide containing at least one rare earth metal, or a mixture thereof, a diffusion barrier layer formed on the contact layer and consisting mainly of iron or an iron alloy, and a solder layer formed on the diffusion barrier layer and consisting mainly of lead and tin.

The electrode assembly, which is bonded to a mount by the solder layer, has a high bonding strength and maintains a satisfactorily low specific contact resistivity at the interface with the semiconductor substrate, even if the latter may have a high resistivity. It can maintain its ohmic property in a temperature range up to 450° C. when the substrate is, for example, of n-type silicon having a resistivity of 0.01 ohm cm, the electrode assembly of this invention makes it possible to attain a specific contact resistivity which is lower than $2 \times 10^{-4}$ ohm cm$^2$, and can maintain its ohmic property in a temperature range from $-30°$ C. to 450° C.

Other features and advantages of this invention will become apparent from the following the description and the accompanying drawings.

DETAILED DESCRIPTION OF THE INVENTION

Figure 1:
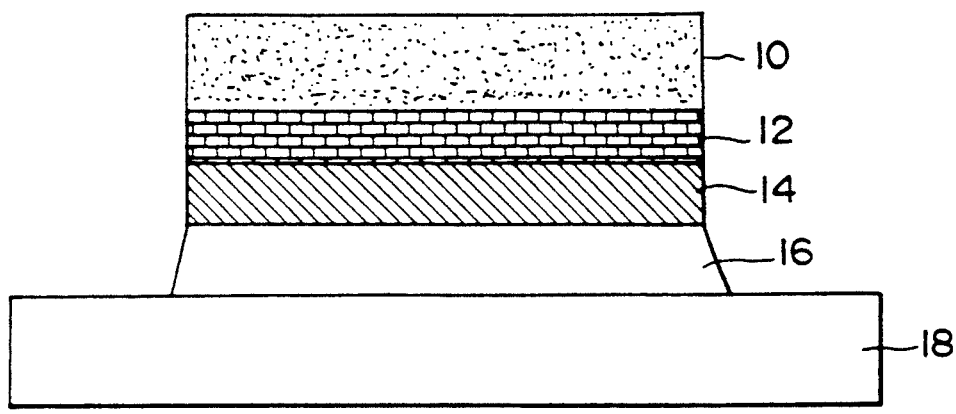
FIG. 1 is a cross sectional view of an electrode assembly according to a first embodiment of this invention.

We, the inventors of this invention, have decided to employ rare-earth metals, or silicides thereof for making an electrode assembly for a semiconductor device, in view of the fact that the rare-earth metals, or silicides have a Schottky-barrier height which is lower than that of chromium or titanium, and therefore offers a specific contact resistivity lower by one figure than what is offered by chromium or titanium. The rare-earth metals, or silicides are, however, easily oxidized, and easily react with nickel, or other metals, and if any such metal, or silicide, or any composite thereof is used to form a contact layer, it is likely that a satisfactorily low specific contact resistivity may fail to be obtained. We have considered that this problem can be overcome if a diffusion barrier layer to be formed on the contact layer is formed from a material which satisfies the following requirements:

(1) it can form a strong bond with any rare-earth metal, or silicide, or a mixture or composite thereof, and does not easily undergo or allow diffusion; and (2) it can be bonded easily and strongly with a solder and prevent the diffusion of tin therefrom.

We have made an extensive series of experiments and found that a material consisting mainly of iron can satisfy the above requirements. We have found that the layer consisting mainly of iron not only can prevent the diffusion of tin, but also cooperates with the rare-earth metal, or silicide layer to prevent the diffusion of iron to a semiconductor substrate even at a high temperature and thereby enable the maintenance of a low specific contact resistivity.

Thus, the electrode assembly of this invention for a semiconductor device comprises a semiconductor substrate, a contact layer formed on the substrate and consisting mainly of at least one rare-earth metal, or a silicide thereof, or a mixture thereof, a diffusion barrier layer formed on the contact layer and consisting mainly of iron or an iron alloy, and a solder layer formed on the diffusion barrier layer and consisting mainly of lead and tin.

The substrate is of e.g. Si or Ge. The contact layer consists mainly of at least one rare-earth metal, such as Sc, Y, La, Ce, or Eu, or silicide thereof, or a mixture or composite of both. The contact layer may contain not more than 7% by weight of oxygen. It may further contain as impurities less than 1% Ca, less than 1% Mg, less than 1% Fe, less than 0.01% Zn, less than 0.01% Si and less than 0.01% Al, all on a weight basis. The contact layer preferably has a thickness of 10 to 1000 nm. If its thickness is smaller than 10 nm, there is a likelihood that the contact layer may not be uniform in thickness, but may have some portions allowing the semiconductor and the diffusion preventing layer to contact each other and produce an undesirably high specific contact resistivity. If its thickness is larger than 1000 nm, a stress in the layer may cause its separation from the assembly.

The diffusion barrier layer consists mainly of iron or an iron alloy. It may contain less than 0.2% C, less than 0.5% Si, less than 1% Mn, less than 0.03% P, less than 0.03% S, less than 2% Cr and less than 0.5% Mo, all on a weight basis. If it contains more of any such impurity than its range as stated above, it is likely that the diffusion of any such impurity into the contact layer may bring about an undesirably high specific contact resistivity. The diffusion barrier layer preferably has a thickness of 50 to 2000nm. If its thickness is smaller than 50 nm, it is likely to allow the diffusion of tin from the solder to the contact layer. If its thickness is larger than 2000 nm, a stress may cause its separation from the assembly.

The diffusion preventing layer consisting mainly of iron prevents not only the diffusion of tin from the solder to the semiconductor substrate, but also the diffusion of iron to the rare-earth metal, or silicide contact layer. Thus, the electrode assembly of this invention is outstandingly stable even at a temperature which is, as high as about 450° C.

Referring briefly to the fabrication of the electrode assembly of this invention by way of example, a silicon substrate is set in an apparatus for physical film formation, as for sputtering or vapor deposition, and the apparatus is evacuated to a pressure of $5 \times 10^{-6}$ torr or below. If sputtering is employed to form a contact layer and a diffusion barrier layer, a rare-earth metal, or silicide film, or a composite film is formed as the contact layer on the substrate by employing, for example, a target composed of a rare-earth metal, sputtering argon gas having a pressure of $5 \times 10^{-3}$ torr and a substrate temperature of 300° C., and a film consisting mainly of iron is, then, formed as the diffusion preventing layer on the contact layer by employing a target composed mainly of iron or an iron alloy. Then, the substrate is removed from the apparatus, and bonded quickly to a mount with a solder consisting mainly of lead and tin.

The invention will now be described by way of more specific examples with reference to the drawings.

EXAMPLE 1

Reference is made to FIG. 1 showing an electrode assembly according to a first embodiment of this invention. It includes a substrate 10 of a single crystal of silicon for a semiconductor device, a contact layer 12 composed of yttrium on the substrate 10, and a diffusion preventing layer 14 of iron formed on the contact layer 12, and is bonded to a mount 18 with a solder 16 consisting mainly of lead and tin. The substrate 10 is a P(phosphorus)-doped n-type (100) silicon wafer having a resistivity of 0.01 ohm cm. The contact layer 12 has a thickness of 100nm, and the diffusion preventing layer 14 has a thickness of 200 nm.

Referring to the fabrication of the electrode assembly, the silicon substrate 10 was set in a sputtering apparatus and the apparatus was evacuated to a pressure of $5 \times 10^{-6}$ torr or below. A film of yttrium was formed as the contact layer 12 on the substrate 10 by DC sputtering employing a target of yttrium, sputtering argon gas having a pressure of $5 \times 10^{-3}$ torr and a substrate temperature of 300° C., and a film of iron as the diffusion barrier layer 14 on the contact layer 12 by employing a target of iron. The substrate 10 was, then, removed from the apparatus, and bonded immediately to the mount 18 by a layer of solder 16 consisting mainly of lead and tin.

Although the foregoing description has been directed to the fabrication of the assembly by sputtering, it has been ascertained that vacuum deposition or ion plating can also be employed for fabricating the electrode assembly of this invention.

The assembly as fabricated showed a specific contact resistivity of $1 \times 10^{-4}$ ohm cm$^2$. It was tested for thermal stability at various temperature as shown in Table 1 below. Table 1 also shows the specific contact resistivity which it showed after its thermal stability test at each temperature. The results shown in Table 1 confirm that the electrode assembly according to the first embodiment of this invention can maintain a satisfactorily low specific contact resistivity of $1.0 \times 10^{-4}$ ohm cm$^2$ to $2.1 \times 10^{-4}$ ohm cm$^2$ even after exposure to the temperatures of 200° to 500° C., and particularly, after exposure to the temperature not exceeding 450° C., it maintains a specific contact resistivity of not more than $2 \times 10^{31\ 4}$ ohm cm$^2$.

Other assemblies embodying this invention were fabricated by employing europium and cerium, instead of yttrium, for the contact layer 12, and were likewise tested. They gave similar results in specific contact resistivity and its thermal stability to those obtained from the assembly having a contact layer of yttrium, as shown in Table 1.

A comparative assembly was fabricated by employing nickel instead of the iron in the assembly of this invention, and was likewise tested for heat resistance. The results are shown in Table 1. As is obvious from it, the comparative assembly showed a specific contact resistivity which was higher by more than one figure.

TABLE 1

| | Electrode construction | Temperature employed for thermal stability test | Specific contact resistivity after the test |
|---|---|---|---|
| Assembly of this invention | Si substrate Y/Fe/Solder/ mount | 200° C. | $1.0 \times 10^{-4}$ $\Omega cm^2$ |
| | | 250° C. | $0.9 \times 10^{-4}$ $\Omega cm^2$ |
| | | 300° C. | $0.9 \times 10^{-4}$ $\Omega cm^2$ |
| | | 350° C. | $1.0 \times 10^{-4}$ $\Omega cm^2$ |
| | | 400° C. | $1.3 \times 10^{-4}$ $\Omega cm^2$ |
| | | 450° C. | $1.8 \times 10^{-4}$ $\Omega cm^2$ |
| | | 500° C. | $2.1 \times 10^{-4}$ $\Omega cm^2$ |
| | Si/Eu/Fe/ Solder/ mount/ | 200° C. | $0.8 \times 10^{-4}$ $\Omega cm^2$ |
| | Si/Ce/Fe/ Solder/mount | 200° C. | $1.3 \times 10^{-4}$ $\Omega cm^2$ |
| Comparative assembly | Si substrate/ Y/Ni/ Solder/mount | 200° C. | $3.0 \times 10^{-3}$ $\Omega cm^2$ |
| | | 300° C. | $8.0 \times 10^{-3}$ $\Omega cm^2$ |
| | | 400° C. | $2.0 \times 10^{-2}$ $\Omega cm^2$ |

EXAMPLE 2

Figure 2:
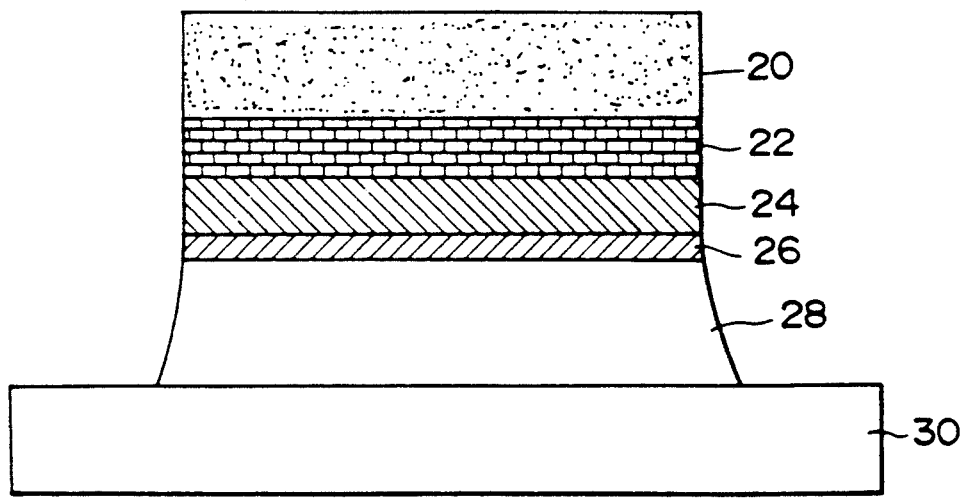
FIG. 2 is a view similar to FIG. 1, but showing a second embodiment of this invention.

FIG. 2 shows an electrode assembly according to a second embodiment of this invention. It includes a substrate 20 formed from a single crystal of silicon, a contact layer 22 formed by a film of yttrium silicide on the substrate 20, a diffusion barrier layer 24 formed by a film of an iron alloy on the contact layer 22, and a gold layer 26 formed on the diffusion barrier layer 24, and is bonded to a mount 30 by a layer 28 of a solder consisting mainly of lead and tin. The assembly was fabricated by employing the sputtering apparatus, and conditions which had been employed in Example 1. The substrate 20 which had been removed from the apparatus after the formation of the three layers 22, 24 and 26 was left to stand in the air for a week, and was thereafter bonded to the mount 30. As the gold layer 26 protects the assembly against oxidation, there is no necessity for immediate soldering after removal from the apparatus, as opposed to the assembly of Example 1.

Example 1 was repeated for the evaluation of the assembly for specific contact resistivity and thermal stability. The results are shown in Table 2 below. These results confirm that the electrode assembly of this invention can maintain a satisfactorily low specific contact resistivity (from $1.0 \times 10^{-4}$ to $3.2 \times 10^{-4}$ ohm $cm^2$) and a satisfactorily high thermal stability even after exposure to the temperature of 200° to 500° C., and particularly after exposure to the temperature not exceeding 450° C., it can maintain not more than $2 \times 10^{-4}$ ohm $cm^2$.

Table 2 also shows a comparative assembly having layers of chromium, nickel and gold formed on a silicon substrate, and the results of its evaluation for specific contact resistivity and thermal stability. As is obvious therefrom, the comparative assembly showed a specific contact resistivity which was higher by one figure than that of the assembly according to this invention. These results confirm that the known assembly cannot form a good ohmic contact with a semiconductor substrate having a high resistivity.

TABLE 2

| | Electrode construction | Temperature employed for thermal stability test | Specific Contact resistivity after the test |
|---|---|---|---|
| Assembly of this invention | Si substrate Y silicide/ Fe alloy/Au Solder/mount | 200° C. | $1.0 \times 10^{-4}$ $\Omega cm^2$ |
| | | 250° C. | $0.8 \times 10^{-4}$ $\Omega cm^2$ |
| | | 300° C. | $0.8 \times 10^{-4}$ $\Omega cm^2$ |
| | | 350° C. | $1.2 \times 10^{-4}$ $\Omega cm^2$ |
| | | 400° C. | $1.5 \times 10^{-4}$ $\Omega cm^2$ |
| | | 450° C. | $1.6 \times 10^{-4}$ $\Omega cm^2$ |
| | | 500° C. | $3.2 \times 10^{-4}$ $\Omega cm^2$ |
| Comparative assembly | Si substrate/ Cr/ Ni/Au/ Solder/mount | 200° C. | $1.0 \times 10^{-3}$ $\Omega cm^2$ |
| | | 300° C. | $1.5 \times 10^{-3}$ $\Omega cm^2$ |
| | | 400° C. | $2.0 \times 10^{-3}$ $\Omega cm^2$ |

What is claimed is:

1. An electrode assembly for a semiconductor device comprising:
   a semiconductor substrate;
   a contact layer formed on said substrate, mainly composed of at least one member selected from the group consisting of rare-earth metals, rare-earth silicides, and mixtures thereof;
   a diffusion barrier layer formed on said contact layer, mainly composed of iron or an iron alloy; and
   a solder layer formed on said diffusion barrier layer, mainly composed of lead and tin,
   wherein said contact layer contains as impurities not more than 7% oxygen, less than 1% Ca, less than 1% Mg, less than 1% Fe, less than 0.01% Zn, less than 0.01% Si and less than 0.01% Al, all on a weight basis.

2. An electrode assembly for a semiconductor device comprising:
   a semiconductor substrate;
   a contact layer formed on said substrate, mainly composed of at least one member selected from the group consisting of rare-earth metals, rare-earth silicides, and mixtures thereof;
   a diffusion barrier layer formed on said contact layer, mainly composed of iron or an iron alloy; and
   a solder layer formed on said diffusion barrier layer, mainly composed of lead and tin,
   wherein said diffusion barrier layer contains as impurities less than 0.2% C, less than 0.5% Si, less than 1% Mn, less than 0.03% P, less than 0.03% S, less than 2% Cr and less than 0.5% Mo, all on a weight basis.

3. An electrode assembly as set forth in claim 1 or 2, wherein said rare-earth metals are yttrium, cerium and europium, and said rare-earth silicides are silicides of yttrium, cerium and europium.

4. An electrode assembly as set forth in claim 1 or 2, wherein said contact layer has a thickness of 10 to 1000 nm.

5. An electrode assembly as set forth in claim 1 or 2, wherein said diffusion barrier layer has a thickness of 50 to 2000 nm.

6. An electrode assembly as set forth in claim 1 or 2, further comprising a gold layer formed between said diffusion barrier layer and said solder layer.

* * * * *